United States Patent [19]

Herko et al.

[11] Patent Number: 5,668,061
[45] Date of Patent: Sep. 16, 1997

[54] METHOD OF BACK CUTTING SILICON WAFERS DURING A DICING PROCEDURE

[75] Inventors: Lawrence H. Herko, Walworth; David J. Collins, Fairport, both of N.Y.; Kevin A. Lindamood, Pittsburgh, Pa.

[73] Assignee: Xerox Corporation, Stamford, Conn.

[21] Appl. No.: 515,629

[22] Filed: Aug. 16, 1995

[51] Int. Cl.$^6$ .................................................. H01L 21/302
[52] U.S. Cl. ........................................ 438/463; 216/27
[58] Field of Search ........................... 437/226; 216/27

[56] References Cited

U.S. PATENT DOCUMENTS

| Re. 32,572 | 1/1988 | Hawkins et al. | 156/626 |
|---|---|---|---|
| 3,654,000 | 4/1972 | Totah et al. | 437/226 |
| 3,913,216 | 10/1975 | Bullonoff | 437/226 |
| 4,033,027 | 7/1977 | Fair et al. | 437/226 |
| 4,729,971 | 3/1988 | Coleman | 437/226 |
| 4,878,992 | 11/1989 | Campanelli | 156/633 |
| 4,978,639 | 12/1990 | Hua et al. | 437/226 |
| 5,408,739 | 4/1995 | Altavela et al. | 29/611 |

*Primary Examiner*—Nam Nguyen
*Assistant Examiner*—Luz Alejandro

[57] ABSTRACT

An improved back cut method is provided in a dicing procedure for separating a plurality of printheads formed in a silicon wafer. The wafer has alignment fiducial marks formed within a composite wafer. Infrared light is directed into the wafer and is reflected back through the wafer from the fiducial marks. The reflected light is detected by a CCD camera mounted on a dicing saw. The fiducial coordinates are stored in memory and displayed so that the dicing saw can be aligned with regard to the alignment marks. A back cut operation is enabled so that the saw partially cuts through the composite wafer. A subsequent dicing step separates individual printheads from the wafer.

6 Claims, 2 Drawing Sheets

METHOD OF BACK CUTTING SILICON WAFERS DURING A DICING PROCEDURE

BACKGROUND AND MATERIAL DISCLOSURE STATEMENT

The present invention is directed to ink jet printheads and, in particular, to an improved method for aligning a pre-sectioning dicing step in the fabrication of thermal ink jet dies.

Thermal ink jet printing systems use thermal energy to produce a vapor bubble in an ink filled channel to expel an ink droplet on demand. Generally, thermal ink jet printing is accomplished by the use of a printhead comprising one or more ink filled channels which communicate with a relatively small supply chamber at one end and have an opening at the opposite end. A resistor is located in each of the channels a predetermined distance upstream from the channel orifice. The resistors are individually addressed with a current pulse to momentarily vaporize the ink and form a bubble which expels an ink droplet. U.S. Pat. No. Re. 32,572 to Hawkins et al., whose contents are hereby incorporated by reference, discloses one embodiment of a thermal ink jet printhead and method of fabrication. A plurality of printheads are concurrently fabricated by forming a plurality of sets of heating elements with their individual addressing electrodes on one substrate surface and etching corresponding sets of grooves which may serve as ink channels with a common reservoir in the surface of a silicon wafer. The heater plate and channel plate are aligned and bonded together to form individual printheads. The individual printheads are obtained by milling away the unwanted silicon material in the etched wafer to expose the addressing electrode terminals on the substrate and then the bonded structure is diced into a plurality of separate printheads.

The bonded structure (wafer) is cut into the individual printhead modules by standard microelectronic IC wafer saws using fiducial marks on the top surface of the wafer. Besides separating the printheads, the dicing process also exposes the nozzles from which ink is ejected, on the front face of the die. In one prior art dicing procedure, the dicing blade cuts completely through the wafer and through a backing material which holds the wafer to a holding frame during the sawing process. The penalty for this complete cut is that some residue is deposited from the backing material onto the front face of the die, thereby possibly affecting the ejection of ink through the nozzles and, hence, print quality.

To circumvent this problem, an alternate dicing procedure is disclosed in U.S. Pat. No. 5,408,739 where a shallow cut is made on the back side of the wafer so that the dicing blade never "sees" any backing material. A reference cut is first made on the top surface of the wafer by aligning the fiducial marks on the top surface and then cutting off two sides of the wafer at a 90° angle to each other. The back cut is then completed by aligning with the two reference cuts. U.S. Pat. No. 5,408,739 suggests that the second 90° reference cuts can be eliminated by using an infrared aligner but without disclosing details of said alignment. Such alignment, in fact, has not hitherto been possible because of the lack of a mechanism for making the first back cut to meet exacting nozzle face tolerances and for lack of a suitable sensor. Vidicon cameras have proved to be too large and heavy.

SUMMARY OF THE INVENTION

It is, therefore, an object of the present invention to provide an improved method of forming a thermal ink jet printhead.

It is a further object of the invention to form a printhead with fewer dicing cuts.

It is a still further object to perform a back cutting operation on a silicon wafer using an infrared alignment method which meets high tolerances for nozzle faces.

These and other objects of the invention are realized by aligning a back cut dicing step directly to dicing fiducial marks formed in a composite wafer. This alignment is enabled by passing white light through a silicon filter to filter out visible light leaving an infrared (IR) component which is directed into the wafer and reflected from opaque fiducial marks back into a CCD camera. Light from the metal (typically aluminum) fiducial marks is reflected into the CCD camera and a visual display is used to align the dicing blade to back cut to the back side of the wafer. While this procedure finds particular efficacy in a dicing method to form a thermal ink jet printhead, the invention would find other applications wherein a cutting procedure is to be implemented on a crystalline block of material which relies upon fiducial marks formed within or on the material.

Thus, in its broadest aspect, the present invention relates to a method for aligning a cutting tool to alignment marks formed within or on the surface of a crystalline material comprising the steps of:

directing infrared (IR) light into the crystalline material so that a portion of the IR light is reflected from the alignment marks out of the material and sensing the reflected light and using the sensed mark locations to guide the cutting tool to make a precise cut into the mark locations.

In a further aspect of the invention, the invention relates to a method of fabricating a plurality of printheads for use in an ink jet printing machine comprising the steps of:

a method of fabricating a plurality of printheads for use in an ink jet printing machine comprising the steps of:

aligning and bonding an upper silicon substrate defining a plurality of ink channel plates with a lower silicon substrate defining a plurality of heater plates, one side of the bonded substrate defining a front nozzle face, the plurality of bonded channel plates and heater plates comprising a plurality of printheads integrally formed on a silicon wafer, forming opaque fiducial alignment marks within the wafer, generating an infrared (IR) component of light, directing the IR component of light through the wafer so that light from the fiducial marks is reflected back through the silicon wafer, sensing the light reflected from the fiducial marks and generating signals which are stored corresponding to the coordinates of said fiducial marks, aligning a dicing saw with the stored coordinates, performing a series of back cut dicing operations using the detected alignment marks as a dicing saw reference and separating the wafer into a plurality of printheads.

DESCRIPTION OF THE INVENTION

As described in the Altavela et al. U.S. Pat. No. 5,408,739, referenced supra, and whose contents are hereby incorporated by reference, a plurality of printheads are formed in a silicon wafer and require separation by dicing steps.

Figure 1:
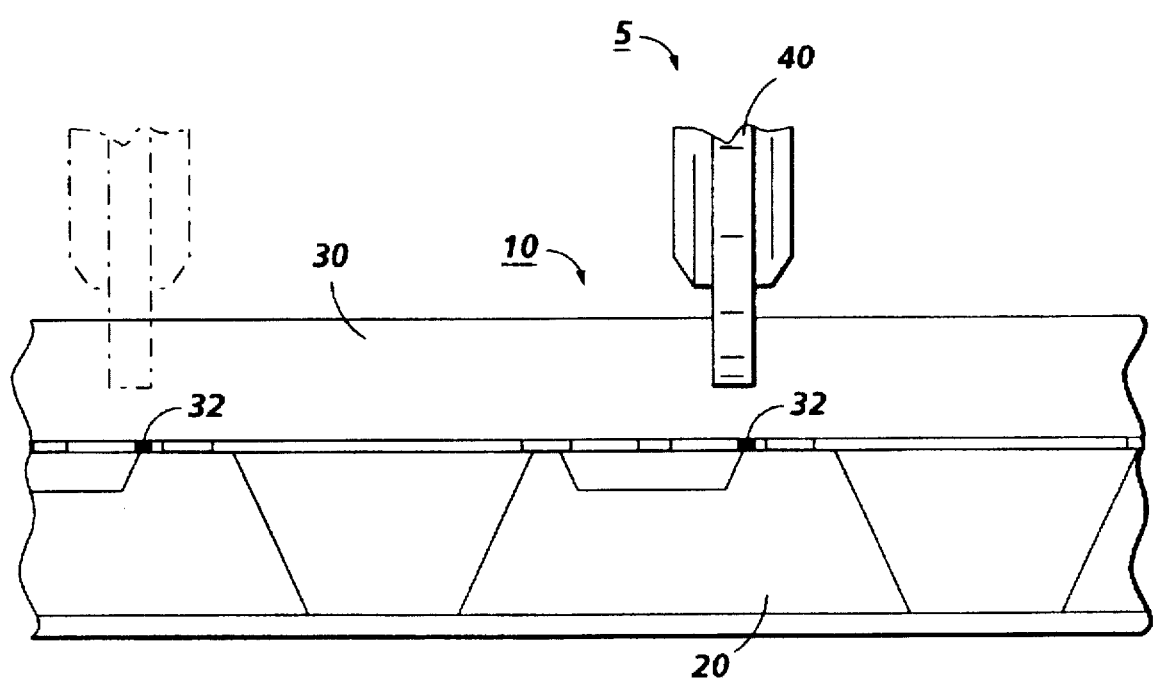
FIG. 1 is a side view of a composite wafer of a semiconductor crystalline material.

FIG. 1 is a side view of an ink jet printhead 5 formed as a composite wafer 10 by bonding together channel wafer 20 and heater wafer 30. As disclosed in the '739 patent, the wafer 10 must be diced to provide a plurality of individual printheads 5, the dicing cuts forming the front nozzle face of each printhead. As part of the dicing procedure, a back cut must be made to the heater wafer 30 side cutting partially but not completely through the wafer. FIG. 1 shows a dicing blade 40 partially cutting the wafer 30. This back cut step is enabled with reference to FIG. 2. The wafer 10 is mounted on a rotatable fixture, not shown but known in the art so that it is stretched over a frame. Each printhead 5 is positioned in a rectangular array. A first dicing cut is made by aligning the dicing blade 40 to make cuts into wafer 30 (back cuts). The back cut alignment is made directly to a plurality of fiducial marks 32 formed on the surface of heater wafer 30, one of which (32) is shown. The key to the alignment technique is to direct infrared light into wafer 10 through wafer 30 to reflect light from the fiducial marks and capture their location in such a way that the coordinates can be stored and, if desired, displayed in an operative connection to the dicing saw.

Figure 2:
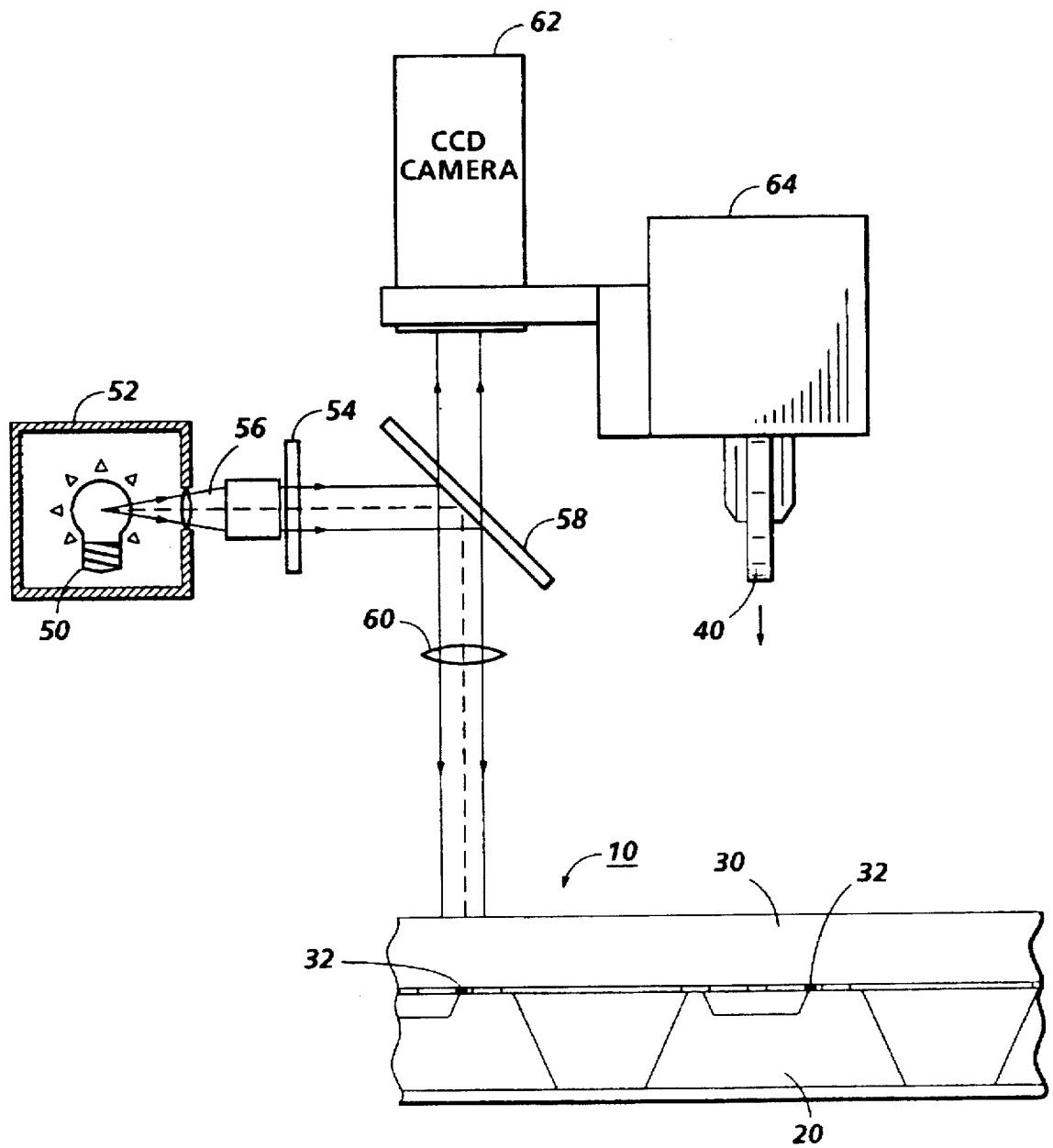
FIG. 2 is a schematic representation of an assembly for illuminating fiducial marks in the wafer of FIG. 1 with IR light to enable a back cut dicing step into the material.

In FIG. 2, the fiducial marks are illuminated by IR radiation passing through the wafer and reflected back through the wafer to be detected by a CCD camera. In a preferred embodiment, a conventional white light source 50, located in light housing 52, is energized and light passes through a filter 54. Filter 54, for this embodiment, is a block of silicon having the same characteristics as wafer 10. The filter 54 transmits the IR component of light from source 50. This IR light passes out of housing 52 and is transmitted through an optic bundle 56. The filtered light is reflected downward into wafer 30 by beam splitter 58. A lens 60 focuses the IR beam onto the top surface of the wafer 30 where the fiducial marks have been formed. The wafer is moved horizontally and vertically so that the entire wafer surface is scanned by the IR light beam. The light passes through the body of the wafer 10 and passes through the wafer except where it is reflected upward by the fiducial marks. The reflected IR light is focused by lens 60, passes through beam splitter 58 and impinges on CCD camera 62 mounted by brackets onto a dicing saw holder 64 which mounts blade 40. The light path between camera 62 and the top surface of wafer 10 can be contained within light baffle guides to minimize stray light. Camera 62 generates electrical signals corresponding to the location and detection of the fiducial marks. These signals are stored in camera memory and are used in a subsequent dicing operation to align the dicing saw with the fiducial marks.

In operation, an operator will align displayed horizontal fiducial marks and begin to make the horizontal dicing cuts partially through wafer 30. When all of the horizontal cuts are made, the wafer mounting table is rotated 90°, and the dicing alignment and back cut are repeated. A second dicing cut is then made from the top side as described in the '739 patent to form the final nozzle face for each printhead. The dicing procedures and characteristics of typical dicing blades are disclosed in U.S. Pat. No. 4,878,992, whose contents are hereby incorporated by reference.

The invention utilizes a CCD camera because of its compactness and lightness, especially when compared with a vidicon camera. The CCD camera fits well in the dicing saw frame 64 but generally has a low response in the near IR. Any visible light entering a CCD camera will cut out the IR image. Hence, the optical arrangement shown in FIG. 2, or its equivalent, is necessary to provide a source of only IR light so that only the IR component of light is reflected into the camera.

While the embodiment disclosed herein was directed to dicing of a specific printhead construction, it will be apparent that the method is applicable to other applications wherein a silicon or other crystalline wafer is required to be partially cut through in conjunction with detection of fiduciary marks which would otherwise be undetectable except for the IR detection procedure described herein. It will, thus, be appreciated that various alternative modifications, variations or improvements therein may be made by those skilled in the art which are intended to be encompassed by the following claims:

We claim:

1. A method of fabricating a plurality of printheads for use in an ink jet printing machine comprising the steps of:

aligning and bonding an upper silicon substrate defining a plurality of ink channel plates with a lower silicon substrate defining a plurality of heater plates, one side of the bonded substrate defining a front nozzle face, the plurality of bonded channel plates and heater plates comprising a plurality of printheads integrally formed on a silicon wafer, forming opaque fiducial alignment marks within the wafer, generating an infrared (IR) component of light, directing the IR component of light through the wafer so that light from the fiducial marks is reflected back through the silicon wafer, sensing the light reflected from the fiducial marks and generating signals which are stored corresponding to the coordinates of said fiducial marks, aligning a dicing saw with the stored coordinates, performing a series of back cut dicing operations using the detected alignment marks as a dicing saw reference and separating the wafer into a plurality of printheads.

2. The method of claim 1, wherein the step of generating an IR light component includes the step of filtering a white light source output by introducing a silicon filter having the same characteristics as the silicon substrate into the light source output.

3. A method for performing an operation with a workpiece on one surface of a silicon wafer using light reflected from fiducial marks representing coordinate positions within the wafer pair to align the workpiece, the steps comprising:

directing infrared light into the wafer in a reflection mode wherein light is reflected from said fiducial marks, positioning a CCD camera in a position to intercept the IR light reflected from the fiducial marks, storing the coordinate information reproduced by the detected fiducial marks in CCD camera memory and generating output signals from said CCD camera corresponding to said stored fiducial mark signals to operate said workpiece to perform an operation on the wafer based on the coordinate locations.

4. The method of claim 3, wherein the operation to be performed is one of dicing the wafer to separate portions of the wafer along lines determined by said coordinate.

5. The method of claim 3, wherein the step of directing infrared light into the wafer includes the step of directing light from a white light source through a filter to allow transmission only of the IR component of the light source.

6. The method of claim 5, wherein the filter is comprised of a silicon member having the same general characteristics as the silicon substrate being operated upon.

* * * * *